(12) United States Patent
Dyer et al.

(10) Patent No.: US 12,155,374 B2
(45) Date of Patent: Nov. 26, 2024

(54) TILED TRANSVERSELY-EXCITED FILM BULK ACOUSTIC RESONATOR HIGH POWER FILTERS

(71) Applicant: Murata Manufacturing Co., Ltd., Nagaokakyo (JP)

(72) Inventors: Greg Dyer, Santa Barbara, CA (US); Wei Yang, Goleta, CA (US); Marie Chantal Mukandatimana, Santa Barbara, CA (US); Luke Myers, Santa Barbara, CA (US); Neal Fenzi, Santa Barbara, CA (US); Andrew Guyette, San Mateo, CA (US); Bryant Garcia, Mississauga (CA)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 361 days.

(21) Appl. No.: 17/588,803

(22) Filed: Jan. 31, 2022

(65) Prior Publication Data
US 2022/0321099 A1 Oct. 6, 2022

Related U.S. Application Data

(60) Provisional application No. 63/169,875, filed on Apr. 2, 2021.

(51) Int. Cl.
*H03H 9/56* (2006.01)
*H03H 7/075* (2006.01)
(Continued)

(52) U.S. Cl.
CPC ............ *H03H 9/568* (2013.01); *H03H 7/075* (2013.01); *H03H 9/605* (2013.01); *H03H 17/0285* (2013.01)

(58) Field of Classification Search
CPC .... H03H 7/075; H03H 17/0285; H03H 9/605; H03H 7/0115; H03H 9/568
(Continued)

(56) References Cited

U.S. PATENT DOCUMENTS

| 5,204,575 A | 4/1993 | Kanda et al. |
| 5,274,345 A | 12/1993 | Gau |

(Continued)

FOREIGN PATENT DOCUMENTS

| CN | 106788318 A | 5/2017 |
| CN | 110417373 A | 11/2019 |

(Continued)

OTHER PUBLICATIONS

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

(Continued)

*Primary Examiner* — Rakesh B Patel
(74) *Attorney, Agent, or Firm* — ARENTFOX SCHIFF LLP

(57) ABSTRACT

Tiled filters are disclosed. A filter includes an n×m array of sub-filters, where n is a number of sub-filters in parallel and m is a number of sub-filters in series. n and m are non-zero positive integers and at least one of n and m is greater than one. All of the nm sub-filters are bandpass filters with substantially the same passbands.

14 Claims, 9 Drawing Sheets

(51) Int. Cl.
*H03H 9/60* (2006.01)
*H03H 17/02* (2006.01)

(58) Field of Classification Search
USPC .............................. 333/175, 186–190, 198
See application file for complete search history.

(56) References Cited

U.S. PATENT DOCUMENTS

| | | |
|---|---|---|
| 5,446,330 A | 8/1995 | Eda et al. |
| 5,552,655 A | 9/1996 | Stokes et al. |
| 5,631,515 A | 5/1997 | Mineyoshi et al. |
| 5,726,610 A | 3/1998 | Allen et al. |
| 5,729,186 A | 3/1998 | Seki et al. |
| 5,853,601 A | 12/1998 | Krishaswamy |
| 6,172,582 B1 | 1/2001 | Hickernell |
| 6,271,617 B1 | 8/2001 | Yoneda et al. |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 6,833,774 B2 | 12/2004 | Abbott et al. |
| 6,914,477 B2 * | 7/2005 | Shibahara ............... H03H 7/01 333/167 |
| 7,009,468 B2 | 3/2006 | Kadota et al. |
| 7,042,132 B2 | 5/2006 | Bauer et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,219,466 B2 | 12/2015 | Meltaus et al. |
| 9,240,768 B2 | 1/2016 | Nishihara et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,564,873 B2 | 2/2017 | Kadota |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,389,391 B2 | 8/2019 | Ito et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,114,996 B2 | 9/2021 | Plesski et al. |
| 11,114,998 B2 | 9/2021 | Garcia et al. |
| 11,139,794 B2 | 10/2021 | Plesski et al. |
| 11,143,561 B2 | 10/2021 | Plesski |
| 11,146,231 B2 | 10/2021 | Plesski |
| 11,146,232 B2 | 10/2021 | Yandrapalli et al. |
| 11,146,238 B2 | 10/2021 | Hammond et al. |
| 11,146,244 B2 | 10/2021 | Yantchev |
| 11,165,407 B2 | 11/2021 | Yantchev |
| 11,171,629 B2 | 11/2021 | Turner |
| 11,323,089 B2 | 5/2022 | Turner |
| 11,368,139 B2 | 6/2022 | Garcia |
| 2002/0079986 A1 | 6/2002 | Ruby et al. |
| 2002/0130736 A1 | 9/2002 | Mukai |
| 2002/0158714 A1 | 10/2002 | Kaitila et al. |
| 2002/0189062 A1 | 12/2002 | Lin et al. |
| 2003/0042998 A1 | 3/2003 | Edmonson |
| 2003/0080831 A1 | 5/2003 | Naumenko et al. |
| 2003/0128081 A1 | 7/2003 | Ella et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0207033 A1 | 10/2004 | Koshido |
| 2004/0207485 A1 | 10/2004 | Kawachi et al. |
| 2004/0261250 A1 | 12/2004 | Kadota et al. |
| 2005/0077982 A1 | 4/2005 | Funasaka |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0131731 A1 | 6/2006 | Sato |
| 2006/0152107 A1 | 7/2006 | Tanaka |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0018414 A1 | 1/2008 | Inoue et al. |
| 2008/0100397 A1 | 5/2008 | Nam et al. |
| 2008/0169884 A1 | 7/2008 | Matsumoto et al. |
| 2008/0246559 A1 | 10/2008 | Ayazi |
| 2008/0297280 A1 | 12/2008 | Thalhammer et al. |
| 2009/0315640 A1 | 12/2009 | Umeda et al. |
| 2010/0019866 A1 | 1/2010 | Hara et al. |
| 2010/0026417 A1 * | 2/2010 | Kubat ............... H03H 9/0057 333/133 |
| 2010/0064492 A1 | 3/2010 | Tanaka |
| 2010/0102669 A1 | 4/2010 | Yamanaka |
| 2010/0123367 A1 | 5/2010 | Tai et al. |
| 2010/0212127 A1 | 8/2010 | Heinze et al. |
| 2010/0223999 A1 | 9/2010 | Onoe |
| 2011/0018389 A1 | 1/2011 | Fukano et al. |
| 2011/0018654 A1 | 1/2011 | Bradley et al. |
| 2011/0102107 A1 | 5/2011 | Onzuka |
| 2011/0109196 A1 | 5/2011 | Goto et al. |
| 2011/0199163 A1 | 8/2011 | Yamanaka |
| 2011/0278993 A1 | 11/2011 | Iwamoto |
| 2012/0073390 A1 | 3/2012 | Zaghloul et al. |
| 2012/0198672 A1 | 8/2012 | Ueda et al. |
| 2012/0286900 A1 | 11/2012 | Kadota et al. |
| 2012/0326809 A1 | 12/2012 | Tsuda |
| 2013/0057360 A1 | 3/2013 | Meltaus et al. |
| 2013/0127551 A1 | 5/2013 | Yamanaka |
| 2013/0234805 A1 | 9/2013 | Takahashi |
| 2013/0271238 A1 | 10/2013 | Onda |

(56) References Cited

U.S. PATENT DOCUMENTS

| | | |
|---|---|---|
| 2013/0278609 A1 | 10/2013 | Stephanou et al. |
| 2013/0321100 A1 | 12/2013 | Wang |
| 2014/0009032 A1 | 1/2014 | Takahashi et al. |
| 2014/0009247 A1 | 1/2014 | Moriya |
| 2014/0113571 A1 | 4/2014 | Fujiwara et al. |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0014795 A1 | 1/2015 | Franosch et al. |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0049920 A1 | 2/2016 | Kishino |
| 2016/0087187 A1 | 3/2016 | Burak |
| 2016/0182009 A1 | 6/2016 | Bhattacharjee |
| 2016/0301382 A1 | 10/2016 | Iwamoto |
| 2017/0063332 A1 | 3/2017 | Gilbert et al. |
| 2017/0104470 A1 | 4/2017 | Koelle et al. |
| 2017/0179225 A1 | 6/2017 | Kishimoto |
| 2017/0179928 A1 | 6/2017 | Raihn et al. |
| 2017/0187352 A1 | 6/2017 | Omura |
| 2017/0201235 A1 | 7/2017 | Freisleben |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0290160 A1 | 10/2017 | Takano et al. |
| 2017/0359050 A1 | 12/2017 | Irieda et al. |
| 2017/0370791 A1 | 12/2017 | Nakamura et al. |
| 2018/0005950 A1 | 1/2018 | Watanabe |
| 2018/0013405 A1 | 1/2018 | Takata |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2018/0278227 A1 | 9/2018 | Hurwitz |
| 2018/0309426 A1 | 10/2018 | Guenard et al. |
| 2019/0007022 A1 | 1/2019 | Goto et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0148621 A1 | 5/2019 | Feldman et al. |
| 2019/0181825 A1 | 6/2019 | Schmalzl et al. |
| 2019/0181833 A1 | 6/2019 | Nosaka |
| 2019/0207583 A1 | 7/2019 | Miura et al. |
| 2019/0245518 A1 | 8/2019 | Ito |
| 2019/0273480 A1 | 9/2019 | Lin et al. |
| 2019/0348966 A1 | 11/2019 | Campanella-Pineda |
| 2019/0379351 A1 | 12/2019 | Miyamoto et al. |
| 2019/0386633 A1 | 12/2019 | Plesski |
| 2019/0386635 A1 | 12/2019 | Plesski et al. |
| 2019/0386636 A1 | 12/2019 | Plesski et al. |
| 2020/0007110 A1 | 1/2020 | Konaka et al. |
| 2020/0014365 A1 | 1/2020 | Nambu et al. |
| 2020/0021271 A1 | 1/2020 | Plesski |
| 2020/0021272 A1 | 1/2020 | Segovia Fernandez et al. |
| 2020/0028489 A1 | 1/2020 | Ta et al. |
| 2020/0036357 A1 | 1/2020 | Mimura |
| 2020/0153412 A1 | 5/2020 | Nosaka |
| 2020/0235719 A1 | 7/2020 | Yantchev et al. |
| 2020/0244247 A1 | 7/2020 | Maeda |
| 2020/0259480 A1 | 8/2020 | Pensala |
| 2020/0274520 A1 | 8/2020 | Shin et al. |
| 2020/0313645 A1 | 10/2020 | Caron |
| 2020/0321939 A1 | 10/2020 | Turner et al. |
| 2020/0328725 A1 | 10/2020 | Jo et al. |
| 2020/0350891 A1 | 11/2020 | Turner |
| 2021/0013859 A1 | 1/2021 | Turner et al. |
| 2021/0044274 A1 | 2/2021 | Turner et al. |
| 2021/0265978 A1 | 8/2021 | Plesski et al. |
| 2021/0273631 A1 | 9/2021 | Jachowski et al. |
| 2021/0313951 A1 | 10/2021 | Yandrapalli et al. |
| 2021/0328574 A1 | 10/2021 | Garcia |
| 2021/0351762 A1 | 11/2021 | Dyer et al. |
| 2022/0029607 A1 | 1/2022 | Turner et al. |
| 2022/0029609 A1 | 1/2022 | Turner et al. |
| 2022/0103160 A1 | 3/2022 | Jachowski et al. |
| 2022/0116015 A1 | 4/2022 | Garcia et al. |
| 2022/0116020 A1 | 4/2022 | Garcia et al. |
| 2022/0123720 A1 | 4/2022 | Garcia et al. |
| 2022/0123723 A1 | 4/2022 | Garcia et al. |
| 2022/0123726 A1 | 4/2022 | Garcia et al. |
| 2022/0149808 A1 | 5/2022 | Dyer et al. |
| 2022/0149814 A1 | 5/2022 | Garcia et al. |
| 2022/0352873 A1 | 11/2022 | Garcia et al. |
| 2023/0025241 A1 | 1/2023 | Dyer |

FOREIGN PATENT DOCUMENTS

| | | |
|---|---|---|
| CN | 210431367 U | 4/2020 |
| JP | H10209804 A | 8/1998 |
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004304622 A | 10/2004 |
| JP | 2006173557 A | 6/2006 |
| JP | 2007251910 A | 9/2007 |
| JP | 2010062816 A | 3/2010 |
| JP | 2010103803 A | 5/2010 |
| JP | 2010233210 A | 10/2010 |
| JP | 2013528996 A | 7/2013 |
| JP | 2015054986 A | 3/2015 |
| JP | 2016001923 A | 1/2016 |
| JP | 2017526254 A | 9/2017 |
| JP | 2017220910 A | 12/2017 |
| JP | 2020155967 A | 9/2020 |
| WO | 2010047114 A1 | 4/2010 |
| WO | 2011131844 A1 | 10/2011 |
| WO | 2013021948 A1 | 2/2013 |
| WO | 2016017104 | 2/2016 |
| WO | 2016052129 A1 | 4/2016 |
| WO | 2016147687 A1 | 9/2016 |
| WO | 2018003273 | 1/2018 |
| WO | 2020092414 A2 | 5/2020 |

OTHER PUBLICATIONS

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Buchanan "Ceramic Materials for Electronics" 3rd Edition, first published in 2004 by Marcel Dekker, Inc. pp. 496 (Year 2004). 00 Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

M. Kadota et al.; "Ultrawide Band Ladder Filter using SH0 plate Wave in Thin LiNb03 Plate and its Application"; 2014 IEEE International Ultrasonics Symposium Proceedings, 2014, pp. 2031-2034. (Year: 2014).

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

(56) References Cited

OTHER PUBLICATIONS

M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).

Material Properties of Tibtech Innovations, © 2018 TIBTECH Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

Rodriguez-Madrid et al., "Super-High-Frequency SAW Resonators on AIN/Diamond", IEEE Electron Device Letters, vol. 33, No. 4, Apr. 2012, pp. 495-497. Year: 2012) 2012.

Safari et al. "Piezoelectric for Transducer Applications" published by Elsevier Science Ltd., pp. 4 (Year: 2000). 2020.

Santosh, G. , Surface acoustic wave devices on silicon using patterned and thin film ZnO, Ph.D. thesis, Feb. 2016, Indian Institute of technology Guwahati, Assam, India Feb. 2016.

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 p. 675 (Year 2015) 00 Jan. 2015.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

USPTO/ISA, International Search Report and Written Opinion for PCT Application No. PCT/US2020/45654 dated Oct. 29, 2020.

USPTO/ISA, International Search Report and Written Opinion for PCT Application No. PCT/US2021/024824 dated Jul. 27, 2021, 9 total pages.

USPTO/ISA, International Search Report and Written Opinion for PCT Application No. PCT/US2021/048505 dated Dec. 1, 2021, 11 total pages.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Zou, Jie "High-Performance Aluminum Nitride Lamb Wave Resonators for RF Front-End Technology" University of California, Berkeley, Summer 2015, pp. 63 (Year 2015) 00 Jan. 2015.

Abass et al., "Effects of inhomogeneous grain size distribution in polycrystalline silicon solar cells," Energy Procedia, 2011, vol. 10, pp. 55-60.

Gnewuch et al., "Broadband monolithic acousto-optic tunable filter," Optics Letters, Mar. 2000, vol. 25, No. 5, pp. 305-307.

Gorisse et al., "Lateral Field Excitation of membrane-based Aluminum Nitride resonators," 2011 Joint Conference of the IEEE International Frequency Control and the European Frequency and Time Forum FCS Proceedings, 2011, 5 pages.

Kadota et al., "Ultra Wideband Ladder Filter Using SH0 Plate Wave in Thin LiNbO3 Plate and Its Application to Tunable Filter," IEEE Transactions on Ultrasonics, Ferroelectrics, and Frequency Control, 2015, vol. 62, No. 5, pp. 939-946.

Pang et al., "Self-Aligned Lateral Field Excitation Film Acoustic Resonator with Very Large Electromechanical Coupling," 2004 IEEE International Ultrasonics, Ferroelectrics and Frequency Control Joint 50th Anniversary Conference, 2004, pp. 558-561.

Reinhardt et al., "Acoustic filters based on thin single crystal LiNbO3 films: status and prospects," IEEE International Ultrasonics Symposium, Sep. 2014, pp. 773-781.

Xue et al., "High Q Lateral-Field-Excited Bulk Resonator Based on Single-Crystal LiTaO3 for 5G Wireless Communication," Journal of Electron Devices Society, Mar. 2021, vol. 9, pp. 353-358.

Yandrapalli et al., "Toward Band n78 Shear Bulk Acoustic Resonators Using Crystalline Y-Cut Lithium Niobate Films wit Spurious Suppression," Journal of Microelectromechanical Systems, Aug. 2023, vol. 32, No. 4, pp. 327-334.

International Search Report and Written Opinion in PCT/US2022/081068, mailed Apr. 18, 2023, 17 pages.

Lam et al., "A Review of Lame and Lamb Mode Crystal Resonators for Timing Applications and Prospects of Lame and Lamb Mode Piezo MEMS Resonators for Filtering Applications," 2018 International Symposium on Acoustic Wave Devices for Future Mobile Communication Systems, Mar. 6-7, 2018, 12 pages.

USPTO/ISA, International Search Report and Written Opinion for PCT Application No. PCT/US2022/022908, mail date Jul. 19, 2022.

\* cited by examiner

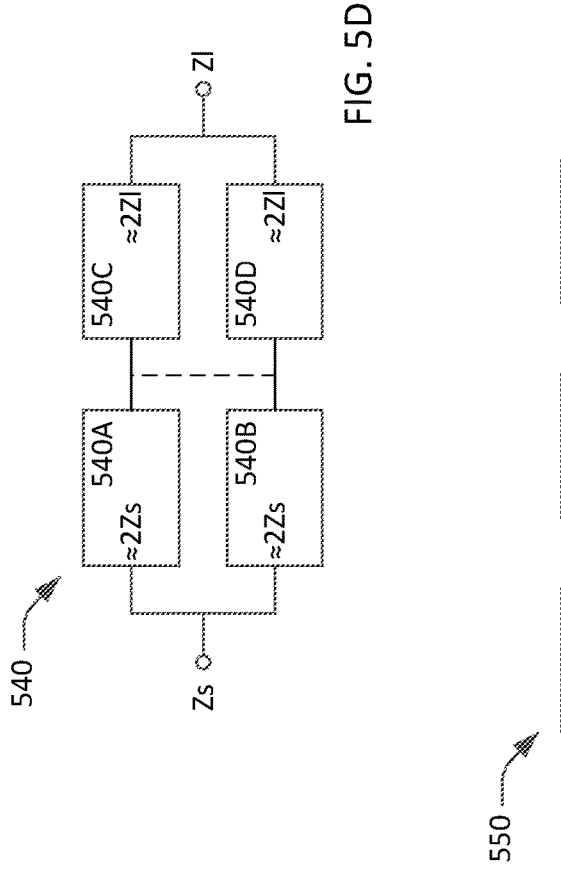
FIG. 5D
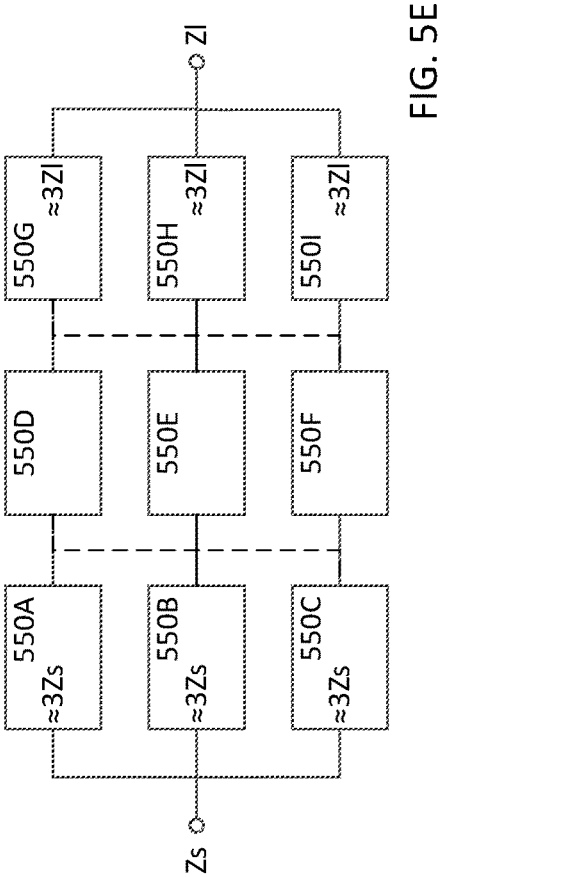
FIG. 5E
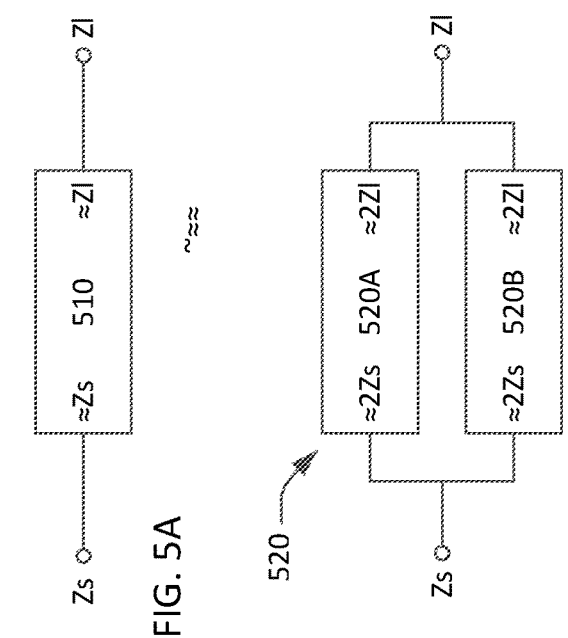
FIG. 5A
FIG. 5B
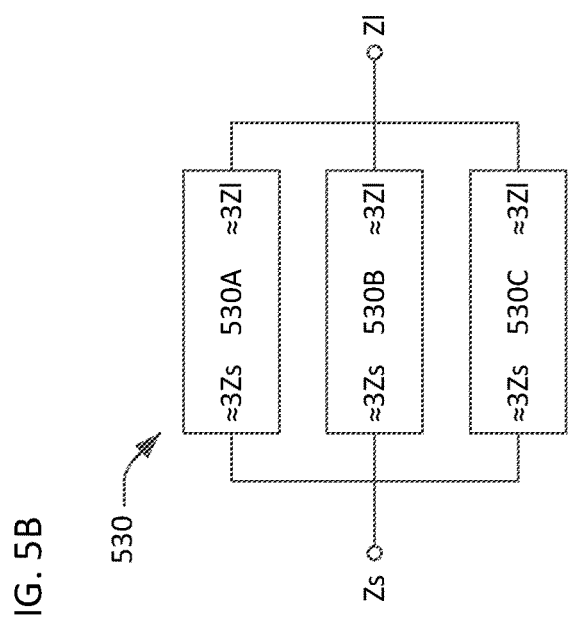
FIG. 5C

TILED TRANSVERSELY-EXCITED FILM BULK ACOUSTIC RESONATOR HIGH POWER FILTERS

RELATED APPLICATION INFORMATION

This patent claim priority to provisional patent application 63/169,875, filed Apr. 2, 2021, entitled TILED XBAR FILTERS FOR HIGH POWER APPLICATIONS, which is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation (5G) mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

DESCRIPTION OF THE DRAWINGS

FIG. 5A, FIG. 5B, FIG. 5C, FIG. 5D and FIG. 5E are schematic block diagrams of various tiled filter configurations.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
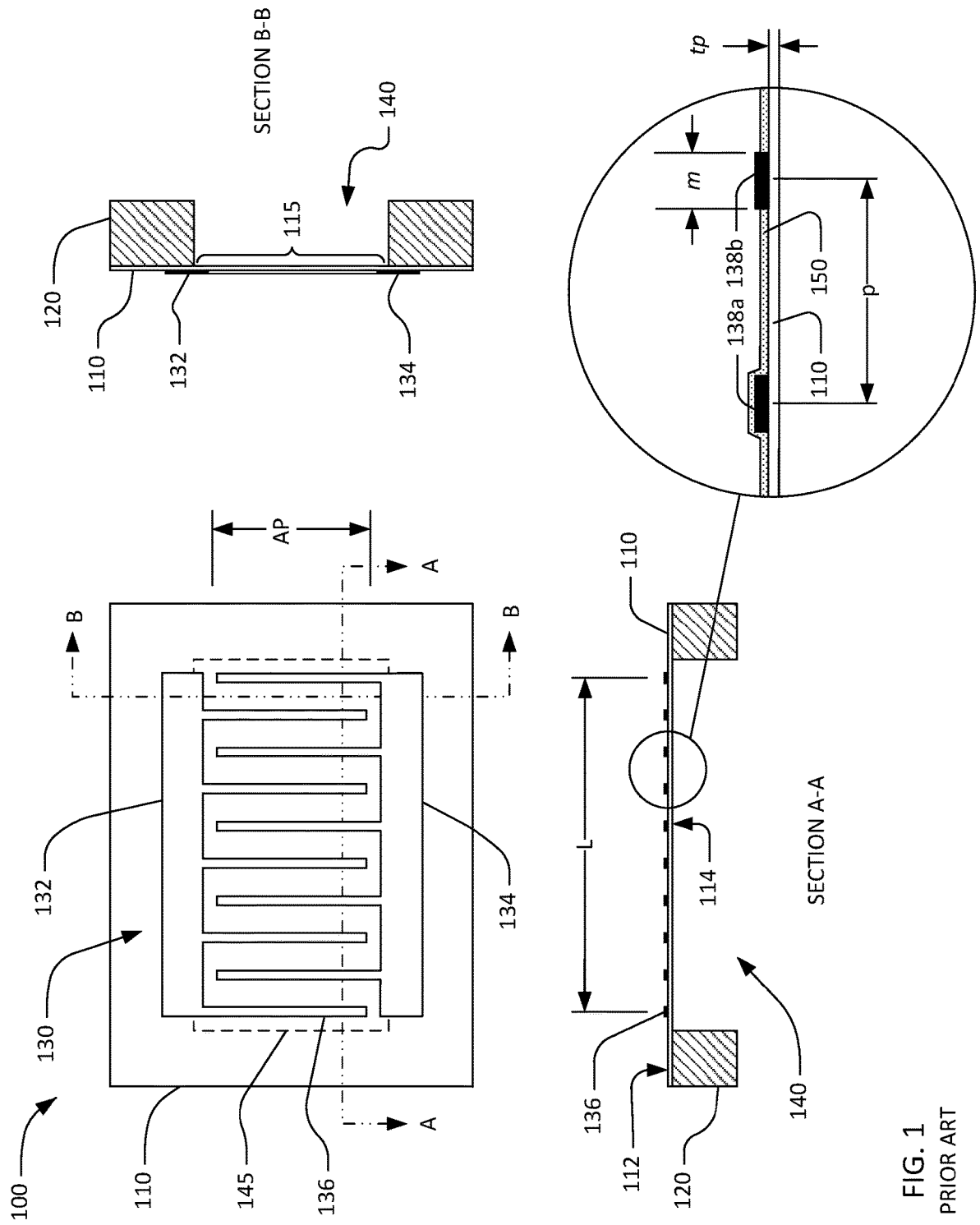
FIG. 1 includes a schematic plan view, two schematic cross-sectional views, and a detail view of a transversely-excited film bulk acoustic resonator (XBAR).

FIG. 1 shows a simplified schematic top view and orthogonal cross-sectional views of an XBAR 100. XBAR resonators such as the resonator 100 may be used in a variety of RF filters including band-reject filters, band-pass filters, duplexers, and multiplexers.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut, which is to say the Z axis is normal to the front and back surfaces 112, 114. The piezoelectric plate may be rotated Z-cut or rotated YX-cut. XBARs may be fabricated on piezoelectric plates with other crystallographic orientations.

The back surface 114 of the piezoelectric plate 110 is attached to a surface of a substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The term "busbar" means a conductor from which the fingers of an IDT extend. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. The primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the diaphragm 115 that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers are greatly exaggerated with respect to the length (dimension L) and aperture (dimension AP) of the XBAR. A typical XBAR has more than ten parallel fingers in the IDT 130. An XBAR may have hundreds, possibly thousands, of parallel fingers in the IDT 130. Similarly, the thicknesses of the IDT fingers and the piezoelectric plate in the cross-sectional views are greatly exaggerated.

Referring now to the detailed schematic cross-sectional view, a front-side dielectric layer 150 may optionally be formed on the front side of the piezoelectric plate 110. The "front side" of the XBAR is, by definition, the surface facing away from the substrate. The front-side dielectric layer 150 may be formed only between the IDT fingers (e.g. IDT finger 138b) or may be deposited as a blanket layer such that the dielectric layer is formed both between and over the IDT fingers (e.g. IDT finger 138a). The front-side dielectric layer 150 may be a non-piezoelectric dielectric material, such as silicon dioxide, alumina, or silicon nitride. A thickness of the front side dielectric layer 150 is typically less than about one-third of the thickness tp of the piezoelectric plate 110. The front-side dielectric layer 150 may be formed of multiple layers of two or more materials. In some applications, a back-side dielectric layer (not shown) may be formed on the back side of the piezoelectric plate 110.

The IDT fingers 138a, 138b may be one or more layers of aluminum, an aluminum alloy, copper, a copper alloy, beryllium, gold, tungsten, molybdenum, chromium, titanium or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. Thin (relative to the total thickness of the conductors) layers of metals such as chromium or titanium may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension m is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT may be 2 to 20 times the width w of the fingers. The pitch p is typically 3.3 to 5 times the width w of the fingers. In addition, the pitch p of the IDT may be 2 to 20 times the thickness of the piezoelectric plate 210. The pitch p of the IDT is typically 5 to 12.5 times the thickness of the piezoelectric plate 210. The width m of the IDT fingers in an XBAR is not constrained to be near one-fourth of the acoustic wavelength at resonance. For example, the width of XBAR IDT fingers may be 500 nm or greater, such that the IDT can be readily fabricated using optical lithography. The thickness of the IDT fingers may be from 100 nm to about equal to the width m. The thickness of the busbars (132, 134) of the IDT may be the same as, or greater than, the thickness tm of the IDT fingers.

Figure 2:
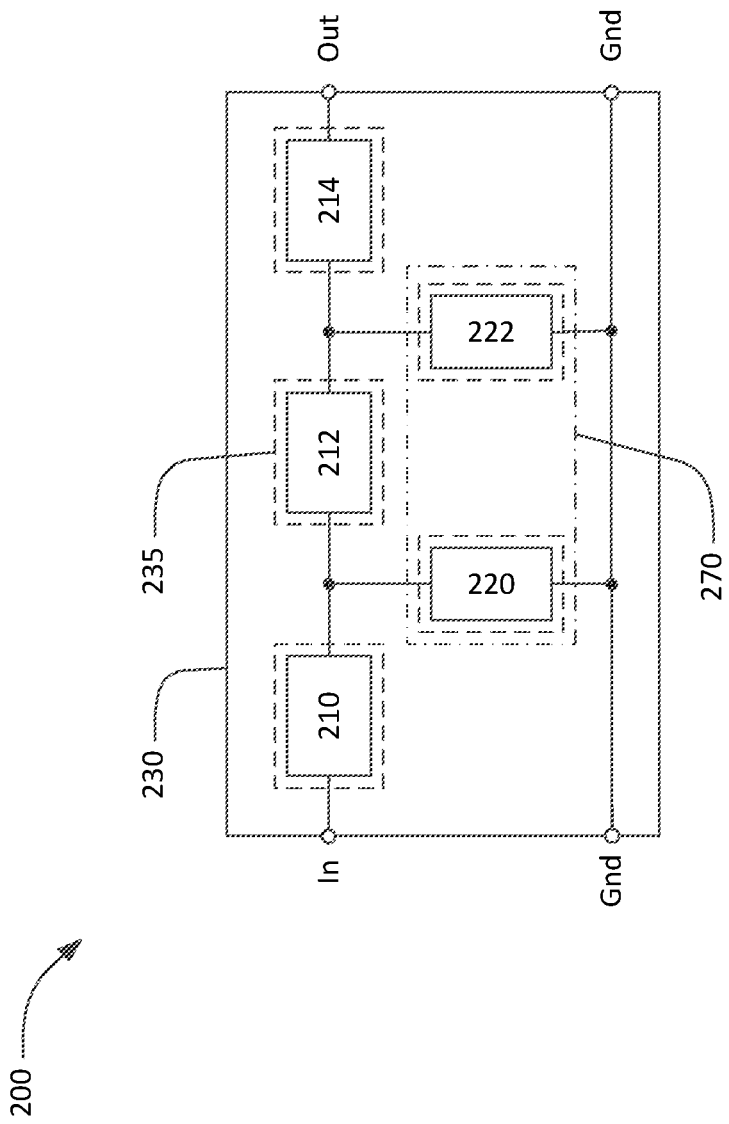
FIG. 2 is a schematic block diagram of an exemplary band-pass filter using acoustic resonators.

FIG. 2 is a schematic circuit diagram and layout for a high frequency band-pass filter 200 using XBARs. The filter 200 has a conventional ladder filter architecture including three series resonators 210, 212, 214 and two shunt resonators 220, 222. The three series resonators 210, 212, and 214 are connected in series between a first port and a second port (hence the term "series resonator"). In FIG. 2, the first and second ports are labeled "In" and "Out", respectively. However, the filter 200 is bidirectional and either port may serve as the input or output of the filter. The two shunt resonators 220, 222 are connected from nodes between the series resonators to ground. A filter may contain additional reactive components, such as capacitors and/or inductors, not shown in FIG. 2. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

In the exemplary filter 200, the three series resonators 210, 212, 214 and the two shunt resonators 220, 222 of the filter 200 are formed on a single plate 230 of piezoelectric material bonded to a silicon substrate (not visible). In some filters, the series resonators and shunt resonators may be formed on different plates of piezoelectric material. Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 2, the cavities are illustrated schematically as the dashed rectangles (such as the rectangle 235). In this example, each IDT is disposed over a respective cavity. In other filters, the IDTs of two or more resonators may be disposed over a single cavity.

Each of the resonators 210, 212, 214, 220, 222 in the filter 200 has resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 200. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's pass-band and the anti-resonance frequencies of the series resonators are positioned above the upper edge of the pass-band. In some filters, a front-side dielectric layer (also called a "frequency setting layer"), represented by the dot-dash rectangle 270, may be formed on the shunt resonators to set the resonance frequencies of the shunt resonators lower relative to the resonance frequencies of the series resonators.

Figure 3:
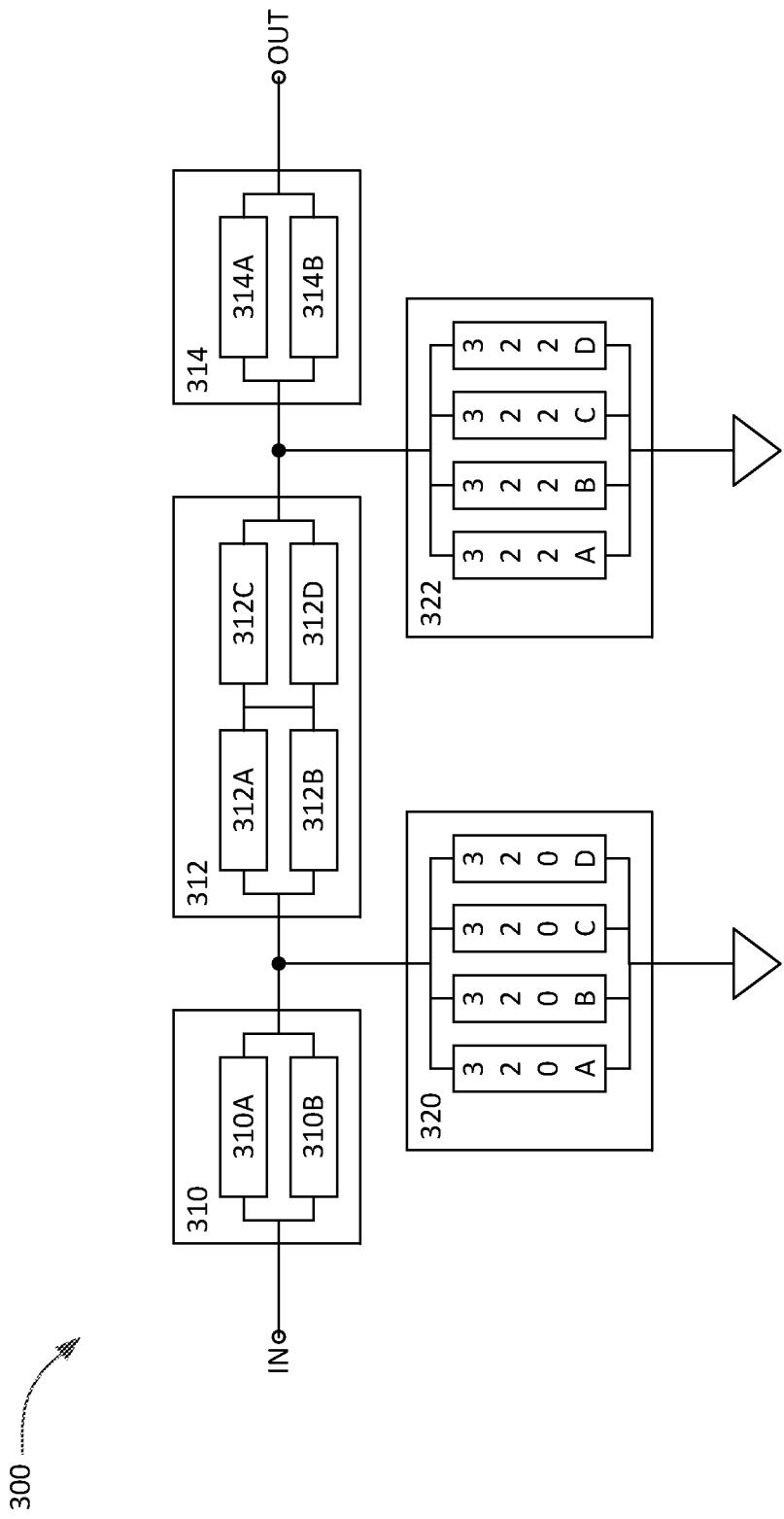
FIG. 3 is a schematic block diagram of another exemplary band-pass filter using XBAR resonators.

FIG. 3 is a schematic circuit diagram for a high frequency band-pass filter 300 using XBARs. Like the filter 200 of FIG. 2, the filter 300 has a conventional ladder filter architecture including three series resonators 310, 312, 314 and two shunt resonators 320, 322. The three series resonators 310, 312, and 314 are connected in series between a first port and a second port, which are labeled "In" and "Out", respectively. However, the filter 300 is bidirectional and either port may serve as the input or output of the filter. The filter 300 may contain additional reactive components, such as capacitors and/or inductors, not shown in FIG. 3. All the shunt resonators and series resonators are XBARs. The inclusion of three series and two shunt resonators is exemplary. A filter may have more or fewer than five total resonators, more or fewer than three series resonators, and more or fewer than two shunt resonators. Typically, all of the series resonators are connected in series between an input and an output of the filter. All of the shunt resonators are typically connected between ground and the input, the output, or a node between two series resonators.

Unlike the filter 200 of FIG. 2, each of the resonators of the filter 300 is divided into multiple sub-resonators. Series resonators 310 and 314 are each divided into two sub-resonators (310A/B and 314A/B respectively) connected in parallel. Series resonator 312 is divided into four sub-resonators 314A/B/C/D which are connected as two parallel-connected pairs in series. Shunt resonators 320 and 322 are each divided into four sub-resonators (320A/B/C/D and 322A/B/C/D respectively) connected in parallel. Dividing resonators into two or four sub-resonators is exemplary. In some filters, resonators may have three or more than four sub-resonators. In some filters, not all resonators are divided into sub-resonators.

Dividing a resonator into multiple sub-resonators reduces the area of each diaphragm which, in turn, reduces the maximum stress in the diaphragm. Dividing a resonator into multiple sub-resonators also provide more flexibility in arranging the resonators on a chip and may facilitate removing heat from the diaphragms.

Figure 4:
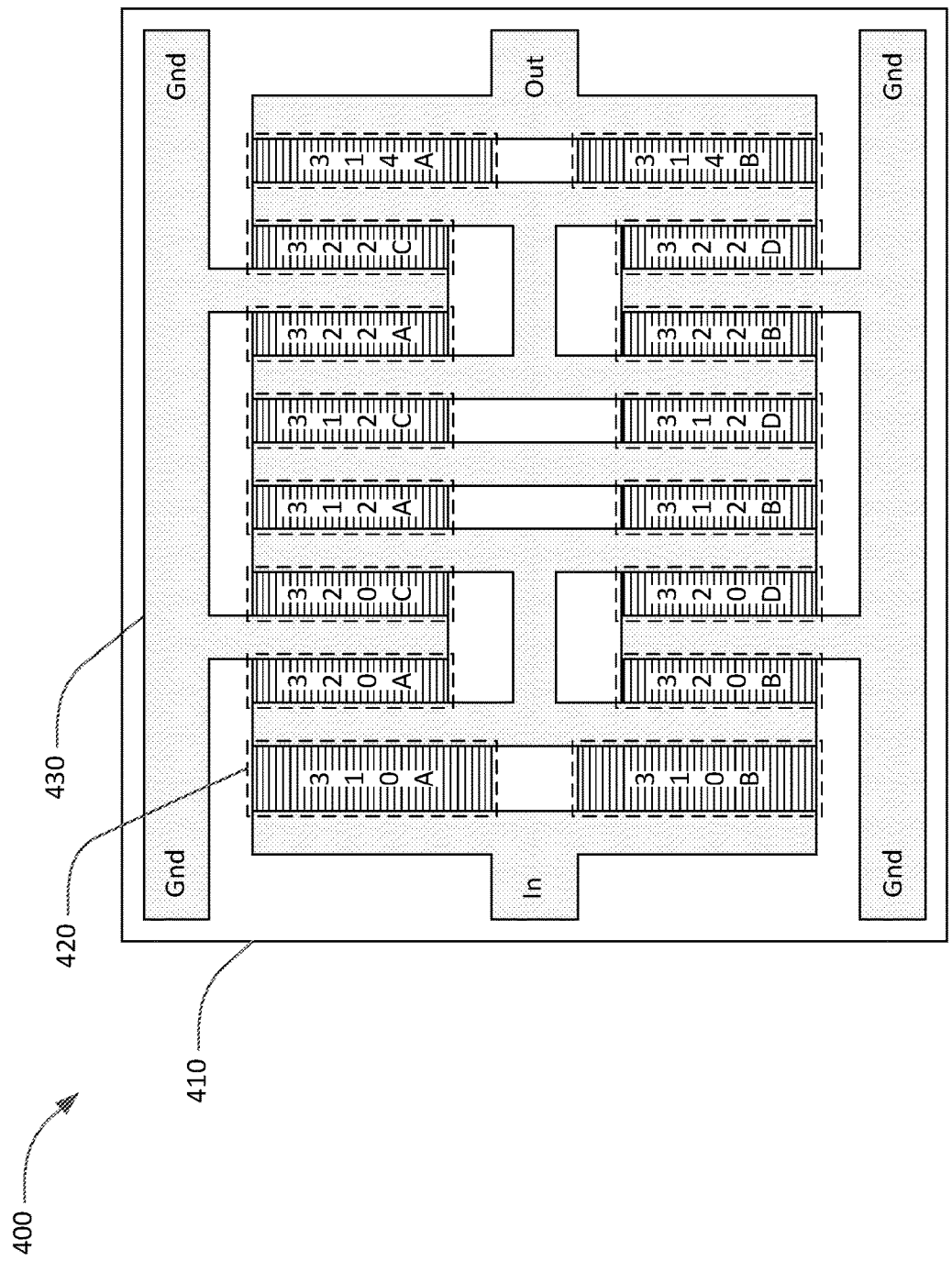
FIG. 4 is a schematic plan view of an embodiment of the filter of FIG. 3.

FIG. 4 is a schematic plan view of a filter 400 which is an embodiment of the filter 300 shown in FIG. 3. The filter 400 is one of innumerable different possible physical implementations of the filter 300. The filter 400 includes a chip 410 with a plurality of sub-resonators represented by horizontally-striped rectangles. Each sub-resonator is labeled with the corresponding identifier from FIG. 3. Dashed rectangles, such as rectangle 420, represent the cavities under each sub-resonator. The sub-resonators are connected by shaded conductors, such as conductor 430. Labels "In", "Out", and "Gnd" identify pads for connections to circuitry external to the filter 400. Connections to the external circuitry may be made using, for example, solder balls or gold bumps to connect the pads on the chip 410 to corresponding pads on a circuit card or interposer. In addition, the conductors, such as conductor 430, and the connections to the external circuitry are the primary means for removing heat from the sub-resonators.

The design of a filter using XBARs is a compromise between many requirements, at least some of which are conflicting. The thickness of the piezoelectric plate (or plates where a filter is divided between two or more chips) is typically dictated, within a narrow range, by the frequency of operation of the filter. The pitch and mark of each resonator are typically constrained within limited ranges to minimize spurious acoustic modes. The overall area of each resonator and the length, aperture, and number of sub-resonators are a compromise between the need to match the input and output impedances of the filter to the external circuitry, the desire to minimize power losses within the filter, and the need to limit the temperature increase of the resonators caused by the power losses. Power losses in XBAR resonators include resistive (i.e. FR losses) in the IDT fingers and other conductors, viscous losses in the piezoelectric diaphragms and IDT fingers, and acoustic energy leakage from the ends and sides of the sub-resonators.

In this application, the term "tiled filter" means a filter implemented with two or more sub-filters connected in series and/or in parallel. The sub-filters may be, but are not necessarily, identical. The sub-filters are all bandpass filters and have substantially the same pass-band and stop-band. In this context, "substantially the same" means the same except for routine manufacturing tolerances. The sub-filters may have similar technical specifications with the exception, in some cases, of input and output impedance. Tiled filters are typically an n×m array rectangular array of sub-filters, where n is a number of sub-filters in parallel and m is a number of sub-filters in series. Both n and m are non-zero positive integers and at least one of n and m is greater than one. All of the n×m sub-filters may be on a common chip or may be divided between two or more chips.

FIG. 5A shows, for reference, a schematic block diagram of a non-tiled filter 510, which could also be described as a 1×1 tiled filter. The filter 510 may be, for example, the filter 300 of FIG. 3 and/or the filter 400 of FIG. 4. In this example and subsequent examples in FIG. 5B to FIG. 5E, it is assumed that the filter input is provided from a source having a source impedance $Zs$ and the output of the filter drives a load having a load impedance $Zl$. $Zs$ and $Zl$ are commonly, but not necessarily, equal. While $Zs=Zl=50$ ohms is common in RF systems, filters using XBARs may be designed to match lower and higher impedance values.

To minimize the power reflected at the input of the filter, the input impedance of the filter should match, or be approximately equal to, the source impedance $Zs$. In FIG. 5 the symbol "≈" means "approximately". Similarly, to minimize the power reflected at the output of the filter, the output impedance of the filter should match, or be approximately equal to, the load impedance $Zl$. What constitutes and acceptable match depends on system requirements. The input and output impedances of the filter may be indirectly specified by specifying a maximum return loss, a maximum reflection coefficient, and/or a maximum VSWR (voltage standing wave ratio) when the filter is coupled to the specified source and load impedances. For example, an acceptable match may be when the magnitude of input or output impedance of a filter is within a factor of 2 (i.e. between 50% and 200%) of the source or load impedance, as appropriate.

FIG. 5B shows a schematic block diagram of a 2×1 tiled filter 520 which includes sub-filters 520A and 520B connected in parallel. The input impedance of each sub-filter 520A, 520B matches $2Zs$ such that the two sub-filters in parallel match $Zs$. The output impedance of each sub-filter 520A, 520B matches $2Zl$ such that the two sub-filters in parallel match $Zl$. The input and output impedances of a filter using XBARs depends heavily on the static capacitance of the XBARs, which in turn depends on the area (aperture×length) and pitch of the IDTs of each resonator. The areas (i.e. the length times the aperture) of the XBARs within sub-resonators 520A, 520B will be roughly half of the areas XBARs within the filter 510. Other features of the sub-resonators, such as bonding pads and conductor line widths, do not necessarily scale with impedance. The area of each sub-filter 520A, 520B may be smaller than the area of filter 510 by a factor less than two. The combined size of the 2×1 tiled filter 520 will typically be larger, by a factor less than two, than the filter 510.

The larger area of the 2×1 tiled filter 520 may allow the filter 520 to tolerate a higher input power level than the filter 510. The input power is divided between the two sub-filters 520A, 520B, resulting in smaller RF current flow in each sub-filter compared to the filter 510. This can result in a reduction in resistive losses in the conductors of the sub-filters and an improvement in the insertion loss of the filter 520 compared to the filter 510.

FIG. 5C shows a schematic block diagram of a 3×1 tiled filter 530 which includes sub-filters 530A, 530B, and 530C connected in parallel. The input impedance of each sub-filter 530A, 530B, 530C matches $3Zs$ such that the three sub-filters in parallel match $Zs$. The output impedance of each sub-filter 530A, 530B, 530C matches $3Zl$ such that the three sub-filters in parallel match $Zl$. The areas (i.e. the length times the aperture) of the XBARs within sub-filters 530A, 530B, 530C will be roughly one-third of the areas XBARs within the filter 510. Other features of the sub-resonators, such as bonding pads and conductor line widths, do not necessarily scale with impedance. The area of each sub-filter 530A, 530B, 530C may be smaller than the area of filter 510 but not by a factor of three. The combined size of the 3×1 tiled filter 530 will typically be larger, by a factor less than three, than the filter 510.

A tiled filter is not limited to three sub-filters in parallel. The architecture of FIG. 5C may be extended to n×1 tiled filters where n is greater than three. n may be limited by the maximum allowable size of the tiled filter for a particular application. Each sub-filter will have an input impedance matched to nZs and an output impedance matched to nZl.

FIG. 5D shows a schematic block diagram of a 2×2 tiled filter 540 which includes sub-filters 540A, 540B, 540C, and 540D. Sub-filters 540A and 540C are connected in series between the input and output of the filter 540. Similarly, sub-filters 540B and 540D are connected in series between the input and output of the filter 540 in parallel with the sub-filters 540A/540C. The dashed line indicates an optional connection between the sub-filters. The inputs of sub-filters 540A and 540B are connected to form the input to the tiled filter 540. The input impedances of sub-filters 540A and 540B match 2Zs such that input to the tiled filter 540 matches Zs. The outputs of sub-filters 540C and 540D are connected to form the output from the tiled filter 540. The output impedances of sub-filters 540C and 540D match 2Zl such that output from the tiled filter 540 matches Zl. Additionally, to minimize power lost within the tiled filter, the output impedance of sub-filters 540A and 540B should match the input impedance of sub-filters 540C and 540D.

The combined size of the 2×2 tiled filter 540 will typically be larger than the filter 510. The larger area of the filter may allow the 2×2 tiled filter 540 to tolerate a proportionally higher input power than the filter 510.

FIG. 5E shows a schematic block diagram of a 3×3 tiled filter 550 which includes nine sub-filters 550A to 550I. Three sets of three sub-filters are connected in parallel between the input and output of the filter 550. The three sub-filters within each set are connected in series. The dashed lines indicate optional connections between the sets of sub-filters. The inputs of sub-filters 550A, 550B, and 550C are connected to form the input to the tiled filter 540. The input impedances of sub-filters 550A, 550B, and 550C match 3Zs such that input to the tiled filter 550 matches Zs. The outputs of sub-filters 550G, 550H, and 550I are connected to form the output from the tiled filter 540. The output impedances of sub-filters 550G, 550H, and 550I match 3Zl such that output from the tiled filter 540 matches Zl.

The combined size of the 3×3 tiled filter 550 will typically be larger than the filter 510. The larger area may allow the 3×3 tiled filter 550 to tolerate a proportionally higher input power than the filter 510.

The tiled filters of FIG. 5A thru FIG. 5E are examples. Other tiled filter configurations are possible.

Figure 6:
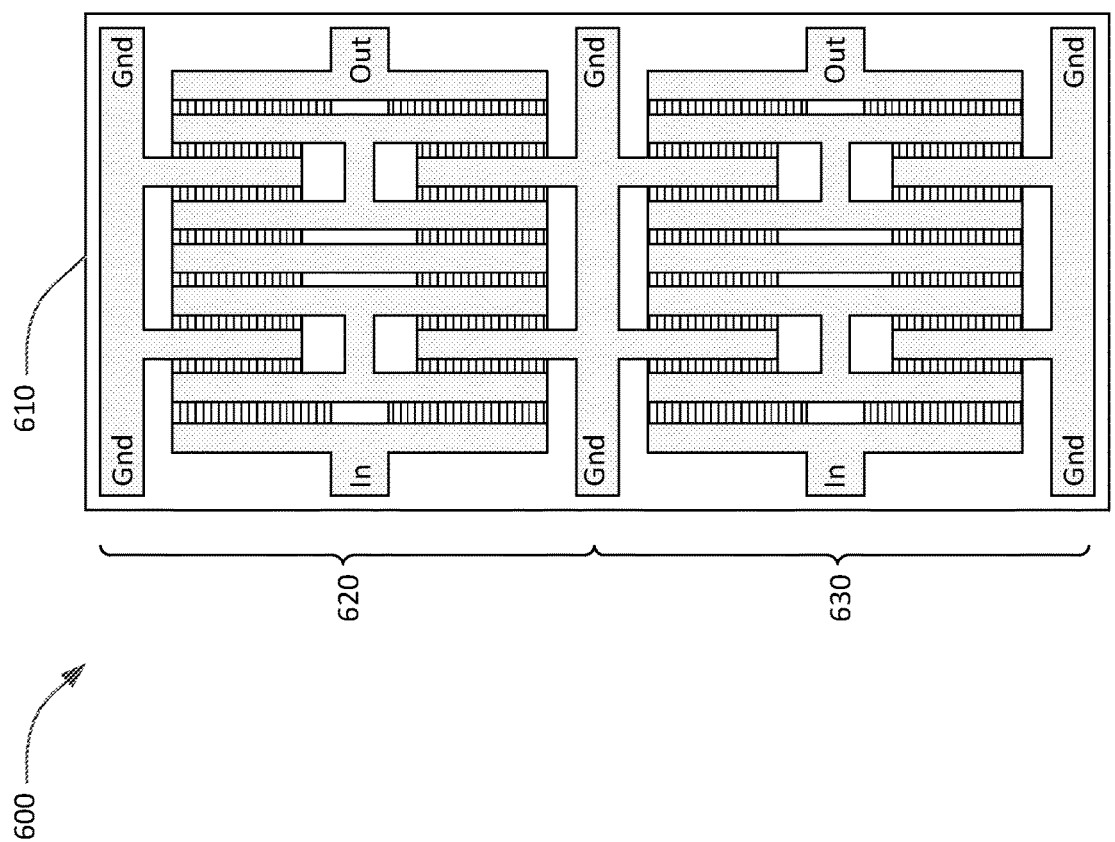
FIG. 6 is a schematic plan view of an example of a 1×2 tiled filter as shown in FIG. 5B.

FIG. 6 is a plan view of an exemplary 2×1 tiled filter 600. In this example, two sub-filters 620, 630 are on a common chip 610. Alternatively, the two sub-filters 620, 630 may be separate chips (not shown). For ease of presentation, each of the sub-filters 620, 630 are identical to the filter 400 of FIG. 4 except that the area (i.e., the product of the aperture and length) of each resonator of the sub-filters 620, 630 is reduced by a factor about two compared to the filter 400. In this example the area of the resonators was reduce by reducing the aperture of each resonator. Alternatively, the length or both the length and width of each resonator could have been reduced. Reducing the area of each resonator reduces the capacitance of each resonator and proportionally increases the impedance of the sub-filters. The "IN" and "OUT" terminals of the sub-filters 620, 630 must be connected external to the chip 610.

In the example of FIG. 6, the area of the chip 610 will be nearly double the area of the filter 400 of FIG. 4. Since the capacitance of the resonators in each sub-filter is reduced by half, the RF current flow through each resonator is also reduced by half. Since the conductor pattern of each sub-filter 620, 630 is the same as the conductor pattern of the filter 400 except for the length of the IDT fingers of each resonator, the resistance through which the RF current flows in each sub-filter 620, 630 and the filter 400 is approximately the same. The ohmic losses, which are proportional to the resistance and the square of the RF current, in each sub-filter 620, 630 will be one-fourth of the ohmic losses in the filter 400. The total ohmic losses of the tiled filter 600 will be roughly one-half of the ohmic losses of the filter 400, and the tiled filter 600 will have correspondingly lower insertion loss in the pass-band of the filter.

Further, the tiled filter 600 has nearly double the area of the filter 400 and ten contact pads, compared to six for the filter 400, to convey heat from the filter. Thus, for equal RG input power, the tiled filter 400 will have a smaller temperature increase than the filter 400.

Figure 7:
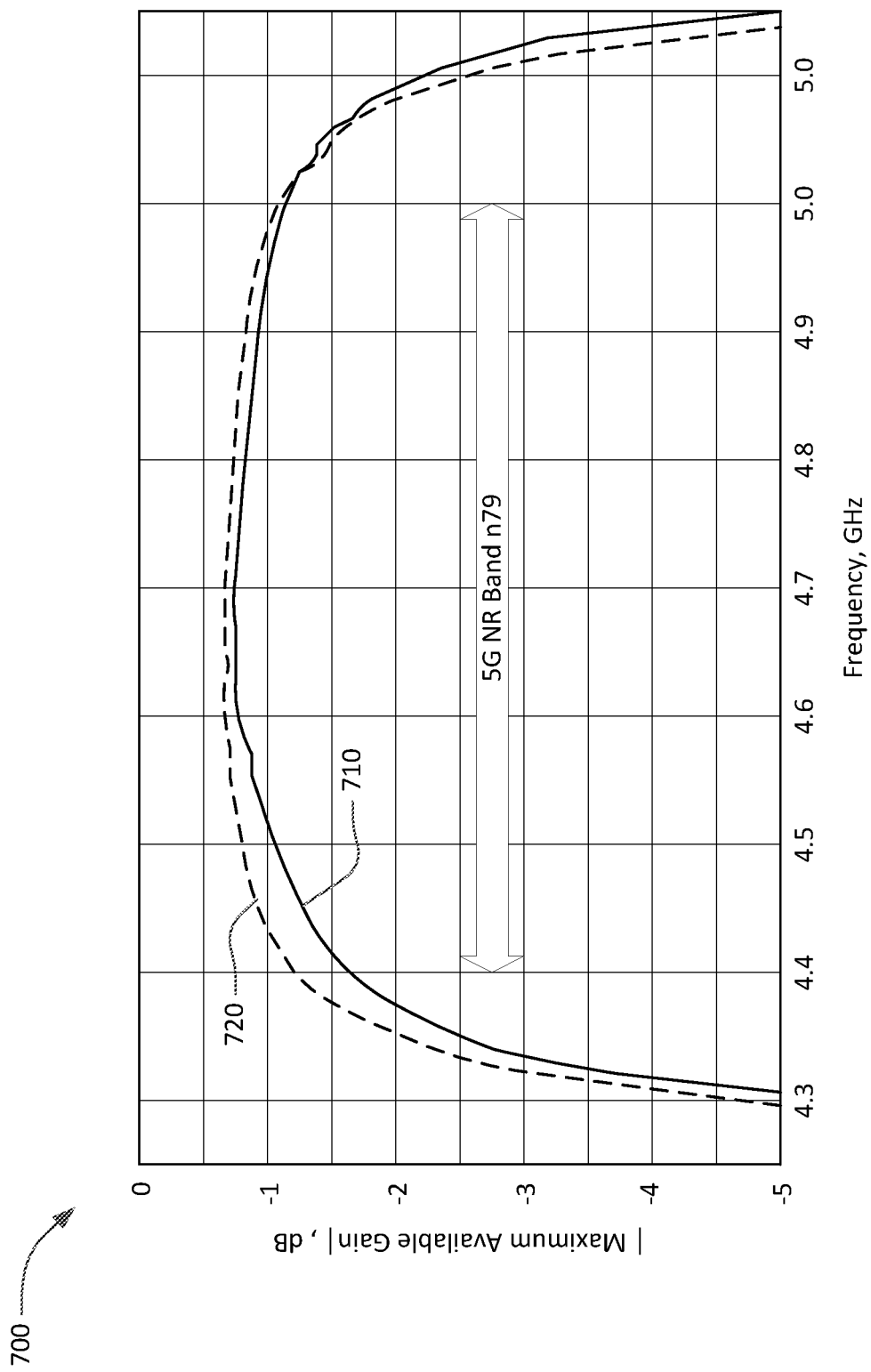
FIG. 7 is a graph of the maximum available gain as a function of frequency for an exemplary tiled filter and a comparable conventional filter.

FIG. 7 is a graph 700 comparing the characteristic of tiled and non-tiled 5G NR Band n79 bandpass filters. Solid curve 710 is a plot of the magnitude of the maximum available gain (MAG) as a function of frequency for an embodiment of the 2×1 tiled filter 600 of FIG. 6. MAG is the input/output transfer function of the filter assuming perfect impedance matching at the input and output. Dashed curve 720 is a plot of the magnitude of the MAG as a function of frequency for an embodiment of the non-tiled filter 400 of FIG. 4. Comparison of the curves 710, 720 shows the MAG of the 2×1 tiled filter is greater by at least 0.1 dB across the n79 band and 0.5 dB larger at the lower band edge at 4.4 GHz. Both curves 710, 720 were determined by simulation of the filters using a finite element method.

Figure 8:
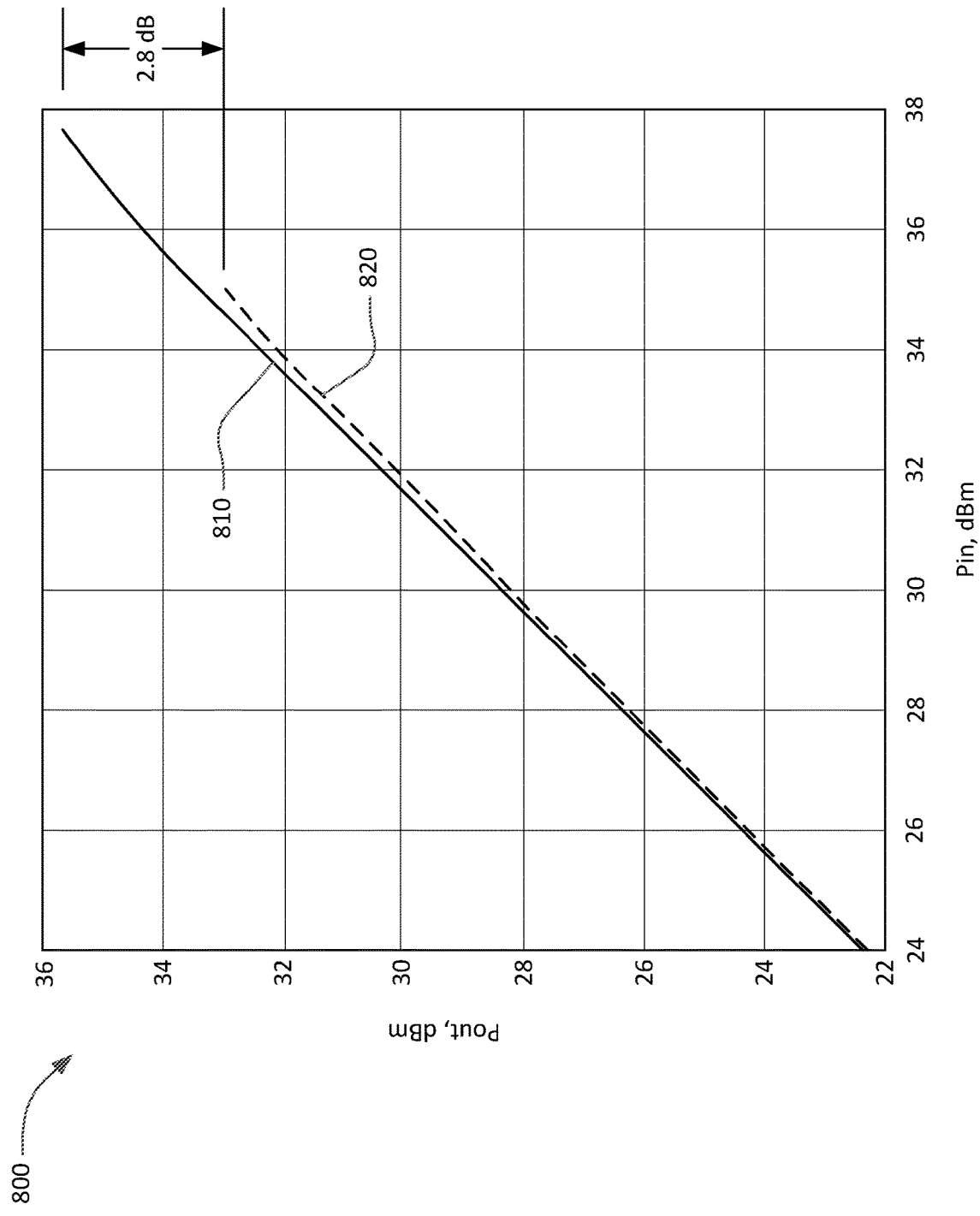
FIG. 8 is a graph comparing the power transfer function of the exemplary tiled filter and the comparable conventional filter.

FIG. 8 is a graph 800 comparing characteristic of the tiled and non-tiled 5G NR Band n79 bandpass filters previously compared in FIG. 7. Solid curve 810 is a plot of output power as a function of input power at the upper band edge (5.0 GHz) for the embodiment of the 2×1 tiled filter 600 of FIG. 6. Dashed curve 820 is a plot of output power as a function of input power at the upper band edge (5.0 GHz) for the non-tiled filter 400 of FIG. 4. In both cases, the input power is limited by a predetermined maximum temperature increase in the filter. Comparison of the curves 810, 820 shows the maximum output power of the 2×1 tiled filter is greater by 2.8 dB compared to the non-tiled filter.

Description of Methods

Figure 9:
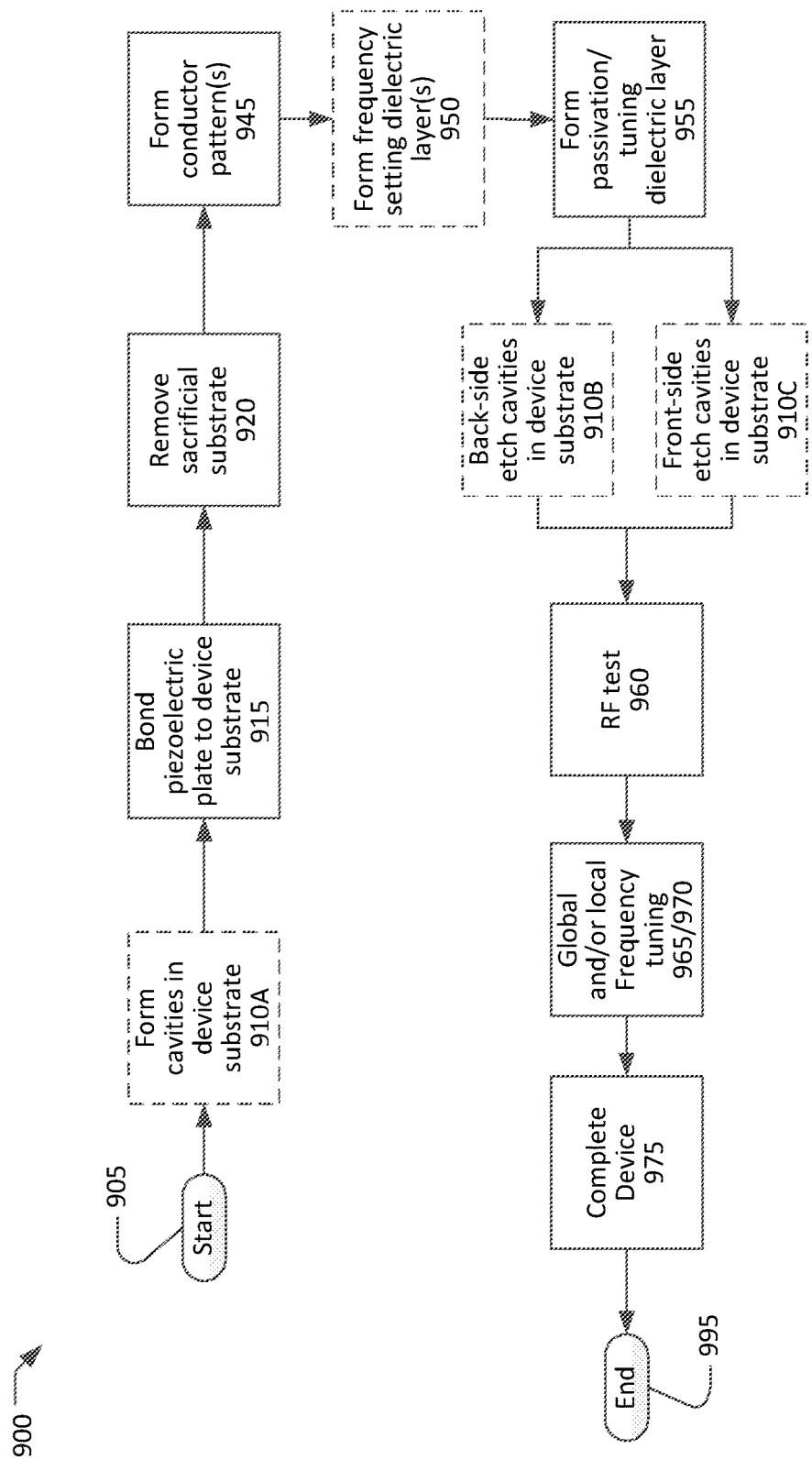
FIG. 9 is a flow chart of a method for fabricating an XBAR or a filter using XBARs.

FIG. 9 is a simplified flow chart summarizing a process 900 for fabricating an XBAR or a filter device incorporating XBARs. The process 900 could be for fabricating a filter device including multiple XBARs, some of which may include a frequency setting dielectric or coating layer. The process 900 starts at 905 with a device substrate and a thin plate of piezoelectric material disposed on a sacrificial substrate. The process 900 ends at 995 with a completed filter device. The flow chart of FIG. 9 includes only major process steps. Various conventional process steps (e.g. surface preparation, cleaning, inspection, baking, annealing, monitoring, testing, etc.) may be performed before, between, after, and during the steps shown in FIG. 9.

While FIG. 9 generally describes a process for fabricating a single filter device, multiple filter devices may be fabricated simultaneously on a common wafer (consisting of a piezoelectric plate bonded to a substrate). In this case, each step of the process 900 may be performed concurrently on all of the filter devices on the wafer. XBARs or XBAR filter devices constructed according to this method can include any of the features described above. Thus, the method would include any steps necessary to include these features including modifications to the structure and the dimensions of the structure, orienting of the crystal structure of the piezoelectric plate, shaping of the electrodes and other structures related to the electrodes, etc.

The flow chart of FIG. 9 captures three variations of the process 900 for making an XBAR which differ in when and how cavities are formed in the device substrate. The cavities may be formed at steps 910A, 910B, or 910C. Only one of these steps is performed in each of the three variations of the process 900.

The piezoelectric plate may typically be lithium niobate, including lithium niobate with a suitable crystal orientation. The piezoelectric plate may be some other material and/or some other cut. The device substrate may preferably be silicon. The device substrate may be some other material that allows formation of deep cavities by etching or other processing.

In one variation of the process 900, one or more cavities are formed in the device substrate at 910A, before the piezoelectric plate is bonded to the substrate at 915. A separate cavity may be formed for each resonator in a filter device. Also, the cavities can be shaped and formed such that two or more resonators can be on one diaphragm over one cavity. The one or more cavities may be formed using conventional photolithographic and etching techniques. Typically, the cavities formed at 910A will not penetrate through the device substrate.

At 915, the piezoelectric plate is bonded to the device substrate. The piezoelectric plate and the device substrate may be bonded by a wafer bonding process. Typically, the mating surfaces of the device substrate and the piezoelectric plate are highly polished. One or more layers of intermediate materials, such as an oxide or metal, may be formed or deposited on the mating surface of one or both of the piezoelectric plate and the device substrate. One or both mating surfaces may be activated using, for example, a plasma process. The mating surfaces may then be pressed together with considerable force to establish molecular bonds between the piezoelectric plate and the device substrate or intermediate material layers.

At 920, the sacrificial substrate may be removed. For example, the piezoelectric plate and the sacrificial substrate may be a wafer of piezoelectric material that has been ion implanted to create defects in the crystal structure along a plane that defines a boundary between what will become the piezoelectric plate and the sacrificial substrate. At 920, the wafer may be split along the defect plane, for example by thermal shock, detaching the sacrificial substrate and leaving the piezoelectric plate bonded to the device substrate. The exposed surface of the piezoelectric plate may be polished or processed in some manner after the sacrificial substrate is detached.

A first conductor pattern, including IDTs and reflector elements of each XBAR, is formed at 945 by depositing and patterning one or more conductor layers on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A second conductor pattern of gold, aluminum, copper or other higher conductivity metal may be formed over portions of the first conductor pattern (for example the IDT bus bars and interconnections between the IDTs).

Each conductor pattern may be formed at 945 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, or other etching techniques.

Alternatively, each conductor pattern may be formed at 945 using a lift-off process. Photoresist may be deposited over the piezoelectric plate and patterned to define the conductor pattern. The conductor layer and, optionally, one or more other layers may be deposited in sequence over the surface of the piezoelectric plate. The photoresist may then be removed, which removes the excess material, leaving the conductor pattern.

At 950, one or more frequency setting dielectric layer(s) optionally may be formed by depositing one or more layers of dielectric material on the front side of the piezoelectric plate. For example, a dielectric layer may be formed over the shunt resonators to lower the frequencies of the shunt resonators relative to the frequencies of the series resonators. The one or more dielectric layers may be deposited using a conventional deposition technique such as physical vapor deposition, atomic layer deposition, chemical vapor deposition, or some other method. One or more lithography processes (using photomasks) may be used to limit the deposition of the dielectric layers to selected areas of the piezoelectric plate. For example, a mask may be used to limit a dielectric layer to cover only the shunt resonators.

At 955, a passivation/tuning dielectric layer is deposited over the piezoelectric plate and conductor patterns. The passivation/tuning dielectric layer may cover the entire surface of the filter except for pads for electrical connections to circuitry external to the filter. In some instantiations of the process 900, the passivation/tuning dielectric layer may be formed after the cavities in the device substrate are etched at either 910B or 910C.

In a second variation of the process 900, one or more cavities are formed in the back side of the device substrate at 910B. A separate cavity may be formed for each resonator in a filter device. Also, the cavities can be shaped and formed such that two or more resonators can be on one diaphragm over one cavity. These resonators sharing a diaphragm are acoustically coupled on an acoustic track. The one or more cavities may be formed using an anisotropic or orientation-dependent dry or wet etch to open holes through the back side of the device substrate to the piezoelectric plate. In this case, the resulting resonator devices will have a cross-section as shown in FIG. 1.

In a third variation of the process 900, one or more cavities in the form of recesses in the device substrate may be formed at 910C by etching the substrate using an etchant introduced through openings in the piezoelectric plate. A separate cavity may be formed for each resonator in a filter device. Also, the cavities can be shaped and formed such that two or more resonators can be on one diaphragm over one cavity. The one or more cavities formed at 910C will not penetrate through the device substrate. For all cavity forming steps 910A, 910B, and 910C, the dimensions of the cavity will be formed with respect to the dimensions of the IDTs of the conductor pattern.

Ideally, after the cavities are formed at 910B or 910C, most or all of the filter devices on a wafer will meet a set of performance requirements. However, normal process tolerances will result in variations in parameters such as the thicknesses of dielectric layer formed at 950 and 955, variations in the thickness and line widths of conductors and IDT fingers formed at 945, and variations in the thickness of the piezoelectric plate. These variations contribute to deviations of the filter device performance from the set of performance requirements.

To improve the yield of filter devices meeting the performance requirements, frequency tuning may be performed by selectively adjusting the thickness of the passivation/tuning layer deposited over the resonators at 955. The frequency of a filter device pass-band can be lowered by adding material to the passivation/tuning layer, and the frequency of the filter device pass-band can be increased by removing material to the passivation/tuning layer. Typically, the process 900 is biased to produce filter devices with pass-bands that are initially lower than a required frequency range but can be tuned to the desired frequency range by removing material from the surface of the passivation/tuning layer.

At 960, a probe card or other means may be used to make electrical connections with the filter to allow radio frequency (RF) tests and measurements of filter characteristics such as input-output transfer function. Typically, RF measurements are made on all, or a large portion, of the filter devices fabricated simultaneously on a common piezoelectric plate and substrate.

At 965, global frequency tuning may be performed by removing material from the surface of the passivation/tuning layer using a selective material removal tool such as, for example, a scanning ion mill as previously described. "Global" tuning is performed with a spatial resolution equal to or larger than an individual filter device. The objective of global tuning is to move the pass-band of each filter device towards a desired frequency range. The test results from 960 may be processed to generate a global contour map indicating the amount of material to be removed as a function of two-dimensional position on the wafer. The material is then removed in accordance with the contour map using the selective material removal tool.

At 970, local frequency tuning may be performed in addition to, or instead of, the global frequency tuning performed at 965. "Local" frequency tuning is performed with a spatial resolution smaller than an individual filter device. The test results from 960 may be processed to generate a map indicating the amount of material to be removed at each filter device. Local frequency tuning may require the use of a mask to restrict the size of the areas from which material is removed. For example, a first mask may be used to restrict tuning to only shunt resonators, and a second mask may be subsequently used to restrict tuning to only series resonators (or vice versa). This would allow independent tuning of the lower band edge (by tuning shunt resonators) and upper band edge (by tuning series resonators) of the filter devices.

After frequency tuning at 965 and/or 970, the filter device is completed at 975. Actions that may occur at 975 include forming bonding pads or solder bumps or other means for making connection between the device and external circuitry (if such pads were not formed at 945); excising individual filter devices from a wafer containing multiple filter devices; other packaging steps; and additional testing. When a tiled filter includes multiple chips, the actions at 975 may include interconnecting the filter chips within a common package. After each filter device is completed, the process ends at 995.

CLOSING COMMENTS

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A filter comprising:
   an n×m array of sub-filters, where;
   n is a number of sub-filters in parallel,
   m is a number of sub-filters in series,
   n and m are non-zero positive integers,
   at least one of n and m is greater than one, and
   all of the nm sub-filters are bandpass filters with substantially the same pass-bands; and
   a filter input connected to inputs of n sub-filters of the nm sub-filters,
   wherein an input of each of the n sub-filters is approximately matched to nZs, where Zs is a system source impedance.

2. The filter of claim 1, wherein each of the nm sub-filters comprises:
   a plurality of transversely-excited film bulk acoustic resonators connected in a ladder filter circuit.

3. The filter of claim 1, wherein Zs=50 ohms, n=2, and the input of the each of the two sub-filters is matched to 100 ohms.

4. The filter of claim 1, wherein Zs=50 ohms, n=3, and the input of the each of the three sub-filters is matched to 150 ohms.

5. A filter comprising:
   an n×m array of sub-filters, where:
   n is a number of sub-filters in parallel,
   m is a number of sub-filters in series,
   n and m are non-zero positive integers,
   at least one of n and m is greater than one, and
   all of the nm sub-filters are bandpass filters with substantially a same pass-band; and
   a filter output connected to outputs of n sub-filters of the nm sub-filters,
   wherein an output of each of the n sub-filters is approximately matched to nZl, where Zl is a system load impedance.

6. The filter of claim 5, wherein Zl=50 ohms, n=2, and the output of the each of the two sub-filters is matched to 100 ohms.

7. The filter of claim 5, wherein Zl=50 ohms, n=3, and the output of the each of the three sub-filters is matched to 150 ohms.

8. A filter comprising:
n sub-filters connected in parallel between a filter input and a filter output,
wherein all of the n sub-filters are bandpass filters with substantially the same pass-bands, and
wherein each of the n sub-filters has an input connected to the filter input, and each of the inputs of the n sub-filters is approximately matched to nZs, where Zs is a system source impedance.

9. The filter of claim 8, wherein Zs=50 ohms, n=2, and the input of the each of the two sub-filters is matched to 100 ohms.

10. The filter of claim 8, wherein each of the n sub-filters comprises:
a plurality of transversely-excited film bulk acoustic resonators connected in a ladder filter circuit.

11. The filter of claim 8, wherein Zs=50 ohms, n=3, and the input of the each of the three sub-filters is matched to 150 ohms.

12. The filter of claim 8, wherein
each of the n sub-filters has an output connected to the filter output, and
each of the outputs of the n sub-filters is approximately matched to nZl, where Zl is a system load impedance.

13. The filter of claim 12, wherein Zl=50 ohms, n=2, and the output of the each of the two sub-filters is matched to 100 ohms.

14. The filter of claim 12, wherein Zl=50 ohms, n=3, and the output of the each of the three sub-filters is matched to 150 ohms.

* * * * *